(12) United States Patent
Farooq et al.

(10) Patent No.: US 8,922,019 B2
(45) Date of Patent: Dec. 30, 2014

(54) SEMICONDUCTOR DEVICE HAVING A COPPER PLUG

(71) Applicant: Internatinoal Business Machines Corporation, Armonk, NY (US)

(72) Inventors: Mukta G. Farooq, Hopewell Junction, NY (US); Emily R. Kinser, Poughkeepsie, NY (US); Ian D. Melville, Highland, NY (US); Krystyna W. Semkow, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/069,282

(22) Filed: Oct. 31, 2013

(65) Prior Publication Data

US 2014/0054778 A1    Feb. 27, 2014

Related U.S. Application Data

(62) Division of application No. 12/573,183, filed on Oct. 5, 2009, now Pat. No. 8,610,283.

(51) Int. Cl.

| | | |
|---|---|---|
| *H01L 23/48* | (2006.01) | |
| *H01L 23/52* | (2006.01) | |
| *H01L 29/40* | (2006.01) | |
| *H01L 23/532* | (2006.01) | |
| *H01L 21/02* | (2006.01) | |
| *H01L 23/00* | (2006.01) | |

(52) U.S. Cl.
CPC . *H01L 21/02697* (2013.01); *H01L 2224/05572* (2013.01); *H01L 2924/01078* (2013.01); *H01L 2224/05007* (2013.01); *H01L 2224/05006* (2013.01); *H01L 2224/03452* (2013.01); *H01L 2224/05147* (2013.01); *H01L 2224/0401* (2013.01); *H01L 2924/01033* (2013.01); *H01L 2924/01029* (2013.01); *H01L 2924/01074* (2013.01); *H01L 23/53238* (2013.01); *H01L 2224/05562* (2013.01); *H01L 24/13* (2013.01); *H01L 2224/05026* (2013.01); *H01L 2224/05027* (2013.01); *H01L 2924/014* (2013.01); *H01L 2224/05157* (2013.01); *H01L 2924/01013* (2013.01); *H01L 2224/131* (2013.01); *H01L 2224/05016* (2013.01); *H01L 2924/01023* (2013.01); *H01L 2224/05124* (2013.01); *H01L 2224/0345* (2013.01); *H01L 2924/01073* (2013.01); *H01L 2224/05187* (2013.01); *H01L 2924/01327* (2013.01); *H01L 24/05* (2013.01); *H01L 2924/04941* (2013.01); *H01L 2924/01032* (2013.01); *H01L 24/03* (2013.01)
USPC ............ 257/751; 257/758; 257/762; 257/774

(58) Field of Classification Search
CPC ................... H01L 21/76877; H01L 21/76897; H01L 21/76804; H01L 23/5226
USPC .................................. 257/751, 758, 762, 774
See application file for complete search history.

(56) References Cited

U.S. PATENT DOCUMENTS

| | | |
|---|---|---|
| 4,814,041 A | 3/1989 | Auda |
| 5,269,880 A | 12/1993 | Jolly et al. |

(Continued)

FOREIGN PATENT DOCUMENTS

| | | |
|---|---|---|
| JP | 2007329508 A | 12/2007 |
| JP | 2008112825 A | 5/2008 |

OTHER PUBLICATIONS

Prosecution History for related U.S. Appl. No. 13/418,261, Amendment to Office Action submitted Dec. 12, 2013, all pages.

(Continued)

*Primary Examiner* — Thien F Tran
(74) *Attorney, Agent, or Firm* — Catherine Ivers; Ira D. Blecker

(57) ABSTRACT

Disclosed is a semiconductor device wherein an insulation layer has a via opening with an aluminum layer in the via opening and in contact with the last wiring layer of the device. There is a barrier layer on the aluminum layer followed by a copper plug which fills the via opening. Also disclosed is a process for making the semiconductor device.

21 Claims, 5 Drawing Sheets

(56) References Cited

U.S. PATENT DOCUMENTS

| | | | |
|---|---|---|---|
| 5,447,887 | A | 9/1995 | Filipiak et al. |
| 5,674,787 | A | 10/1997 | Zhao et al. |
| 5,770,517 | A | 6/1998 | Gardner et al. |
| 5,955,785 | A | 9/1999 | Gardner et al. |
| 6,133,136 | A | 10/2000 | Edelstein et al. |
| 6,143,657 | A | 11/2000 | Liu et al. |
| 6,214,728 | B1 | 4/2001 | Chan et al. |
| 6,218,302 | B1 | 4/2001 | Braeckelmann et al. |
| 6,376,353 | B1 | 4/2002 | Zhou et al. |
| 6,472,304 | B2 | 10/2002 | Chittipeddi et al. |
| 6,492,270 | B1 | 12/2002 | Lou |
| 6,537,913 | B2 | 3/2003 | Modak |
| 6,620,663 | B1 | 9/2003 | Sune |
| 6,696,761 | B2 | 2/2004 | Chan et al. |
| 6,747,355 | B2 | 6/2004 | Abiru et al. |
| 6,806,578 | B2 | 10/2004 | Howell et al. |
| 6,887,790 | B1 | 5/2005 | Bao et al. |
| 6,939,800 | B1 | 9/2005 | Lu et al. |
| 7,361,993 | B2 | 4/2008 | Coolbaugh et al. |
| 7,390,739 | B2 * | 6/2008 | Lazovsky et al. ............. 438/653 |
| 2004/0241978 | A1 | 12/2004 | Hsiung et al. |
| 2005/0001321 | A1 | 1/2005 | Hsiung et al. |
| 2005/0014356 | A1 | 1/2005 | Pozder et al. |
| 2005/0127530 | A1 | 6/2005 | Fan et al. |
| 2005/0160575 | A1 | 7/2005 | Gambino et al. |
| 2005/0189653 | A1 | 9/2005 | Tao et al. |
| 2006/0202339 | A1 | 9/2006 | Michaelson et al. |
| 2008/0194095 | A1 | 8/2008 | Daubenspeck et al. |
| 2008/0265417 | A1 | 10/2008 | Kawamura et al. |
| 2009/0206490 | A1 | 8/2009 | Koide et al. |
| 2009/0243098 | A1 | 10/2009 | Farooq et al. |
| 2010/0167522 | A1 | 7/2010 | Daubenspeck et al. |

OTHER PUBLICATIONS

Prosecution History of related U.S. Appl. No. 13/418,261, Notice of Allowance mailed Jan. 24, 2014, all pages.
Prosecution History of related U.S. Appl. No. 13/767,845, Notice of Allowance mailed Jan. 29, 2014, all pages.
Prosecution History for related U.S. Appl. No. 12/573,183, Office Action having a Notifcation Date of Jul. 6, 2011. all pages.
Prosecution History for related U.S. Appl. No. 12/573,183, Amendment to Office Action submitted Oct. 5, 2011, all pages.
Prosecution History for related U.S. Appl. No. 12/573,183, Office Action having a Notifcation Date of Dec. 16, 2011. all pages.
Prosecution History for related U.S. Appl. No. 12/573,183, Amendment to Office Action submitted Mar. 12, 2012, all pages.
Prosecution History for related U.S. Appl. No. 12/573,183, Office Action having a Notifcation Date of Dec. 7, 2012. all pages.
Prosecution History for related U.S. Appl. No. 12/573,183, Amendment to Office Action submitted Mar. 6, 2013, all pages.
Prosecution History for related U.S. Appl. No. 12/573,183, Office Action having a Notifcation Date of Jun. 3, 2013. all pages.
Prosecution History for related U.S. Appl. No. 12/573,183, Amendment to Office Action submitted Jul. 30, 2013, all pages.
Prosecution History for related U.S. Appl. No. 12/573,183, Notice of Allowance having a Notifcation Date of Aug. 13, 2013. all pages.
Prosecution History for related U.S. Appl. No. 12/573,183, German Office Action from Applicants' counterpart patent application, date Oct. 9, 2012, all pages.
Prosecution History for related U.S. Appl. No. 13/418,261, Office Action having a Notifcation Date of Mar. 1, 2013. all pages.
Prosecution History for related U.S. Appl. No. 13/418,261, Amendment to Office Action submitted Jun. 1, 2013, all pages.
Prosecution History for related U.S. Appl. No. 13/418,261, Office Action having a Notifcation Date of Sep. 13, 2013. all pages.
Prosecution History for related U.S. Appl. No. 13/767,845, Office Action having a Notifcation Date of Oct. 10, 2013. all pages.
Prosecution History for related U.S. Appl. No. 13/767,845, Office Action having a Notification Date of Oct. 10, 2013. all pages.
Prosecution History for related U.S. Appl. No. 13/767,845, Amendment to Office Action submitted Jan. 2, 2014, all pages.

* cited by examiner

SEMICONDUCTOR DEVICE HAVING A COPPER PLUG

RELATED APPLICATION

This application is a divisional of U.S. patent application Ser. 12/573,183, filed Oct. 5, 2009, entitled "SEMICONDUCTOR DEVICE HAVING A COPPER PLUG", now U.S. Pat. No. 8,610,283, the disclosure of which is incorporated by reference herein.

BACKGROUND OF THE INVENTION

The present invention relates to a semiconductor device and, more particularly, relates to a semiconductor device suitable for flip chip joining to a package and having a copper plug.

So-called flip chip packages are commonly used for joining semiconductor devices to packages as they offer several advantages over traditional wire-bonded packages. These advantages include compactness, ruggedness, and cost. In a semiconductor device for flip chip joining, the semiconductor device has a layer of insulation and a final layer of passivation in which there is a via opening for receiving ball limiting metallurgy (sometimes called underbump metallurgy) and then a quantity of solder. The insulation layer material may be, for example, a silicon nitride or silicon oxide and the final passivation layer material may be, for example, a polyimide or a photosensitive polyimide.

The finished semiconductor chip having the ball limiting metallurgy and solder may be placed in contact with a package such as a printed circuit board or ceramic substrate then heated to cause the solder to reflow and join the semiconductor chip to the package.

BRIEF SUMMARY OF THE INVENTION

The present invention replaces the last aluminum layer currently in use on semiconductor devices with a copper plug in the insulation layer of the structure. The embodiments of the present invention address electromigration and structural issues of the semiconductor designs currently using the last aluminum layer.

The various advantages and purposes of the present invention as described above and hereafter are achieved by providing, according to a first aspect of the invention, a semiconductor device including a semiconductor substrate having a plurality of wiring layers wherein the last wiring layer includes a conductive material, an insulation layer formed on the last wiring layer, the insulation layer having a via opening formed therein to expose the conductive material in the last wiring layer, an aluminum layer formed in the via opening, a barrier layer formed on the aluminum layer and a copper plug formed on the barrier layer and filling the via opening.

According to a second aspect of the invention, there is provided a method of forming a semiconductor device which includes obtaining a semiconductor substrate having a plurality of wiring layers wherein the last wiring layer includes a conductive material, forming an insulation layer on the last wiring layer, forming a via opening in the insulation layer, forming an aluminum layer in the via opening, forming a barrier layer on the aluminum layer and forming a copper plug on the barrier layer and filling the via opening.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
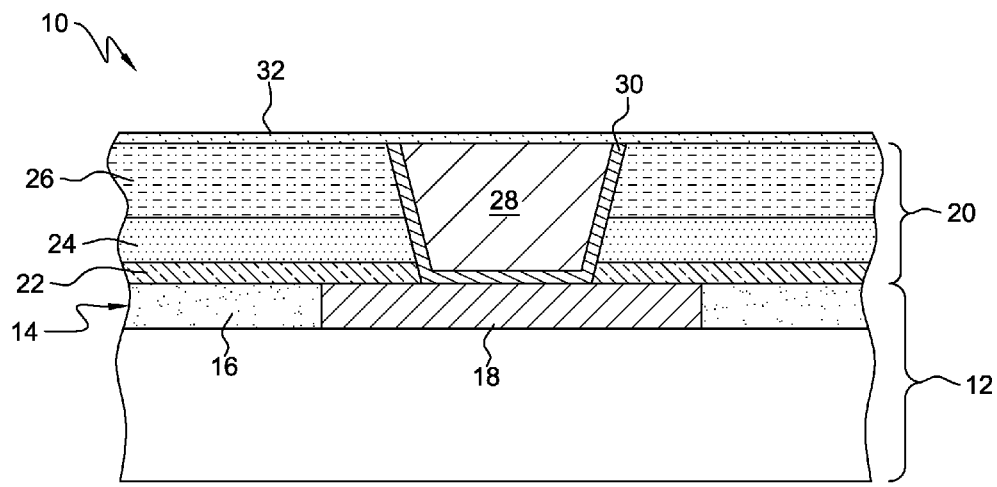
FIG. 1 is a cross section of a first embodiment of the present invention having an insulation layer with a copper plug.

Referring to the Figures in more detail, and particularly referring to FIG. 1, there is shown a cross section of a first embodiment of the present invention. Semiconductor device 10 comprises a semiconductor substrate 12 which includes the semiconductor material, the front end of the line features such as the transistors and the back end of the line wiring layers. Only the last wiring layer 14 is shown in FIG. 1 for the sake of clarity. Last wiring layer 14 includes a dielectric material 16 and metallic wiring line 18. The composition of metallic wiring line 18 is not limited to any specific metallurgy; for example, aluminum, aluminum-copper alloys, copper, copper alloys, or other conducting materials known to those practicing the art may be used for metallic wiring line 18. The semiconductor material may be any semiconductor material including but not limited to group IV semiconductors such as silicon, silicon germanium or germanium, a III-V compound semiconductor, or a II-VI compound semiconductor.

The metal in the metallic wiring line 18 is preferably copper due to its desirable electrical properties. There are also problems inherent in the use of copper including electromigration issues which can affect reliability. Also, copper must be protected from the atmosphere to avoid oxidation and the formation of resistive intermetallic byproducts that negatively impact electromigration performance.

Accordingly, the present inventors have proposed a copper plug in the insulation layer which serves to provide a conductive material for wafer finishing and a planar surface for subsequent ball limiting metallurgy deposition processes. The copper plug also prevents damage to the underlying copper wiring layers.

Referring still to FIG. 1, semiconductor device 10 comprises an insulation layer 20 which may further comprise one or more individual sublayers. In one preferred embodiment, insulation layer 20 includes an NBLoK (NBLoK is a trademark of Applied Materials, Inc.) sublayer 22 (NBLoK is a nitrogen-doped silicon carbide), a silicon dioxide sublayer 24 and a silicon nitride sublayer 26. Silicon nitride may be substituted for the NBLoK sublayer 22 as an alternative. Other materials can be used for the insulation layer 20. In another embodiment, there may be an additional nitride sublayer (not shown) between sublayer 22 and sublayer 24. The insulating layer 20 could comprise any dielectric material or materials that would serve as an electrically insulating layer. For purposes of illustration and not limitation, such a dielectric material could be a low dielectric material such as a SiCOH composition. Included within insulation layer 20 is a copper plug 28 and preferably there is a barrier layer 30 of, for example, tantalum and tantalum nitride. Other materials could be used for the barrier layer 30 such as titanium, titanium tungsten, titanium nitride or tungsten nitride Most preferably, semiconductor device 10 also includes a cap layer 32 for protecting the copper plug 28 from oxidation. The cap layer 32 may be a nitride such as NBLoK but other materials such as silicon nitride, tantalum nitride or titanium nitride may also be used for the cap layer 32.

Figure 2:
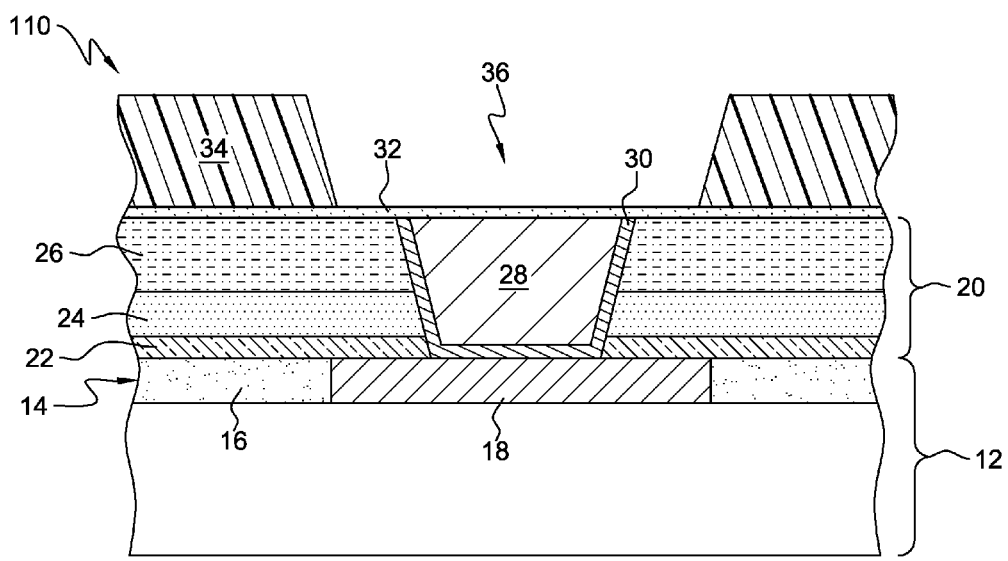
FIG. 2 is a cross section of a second embodiment of the present invention having an insulation layer with a copper plug and a passivation layer.

Referring now to FIG. 2, a second embodiment of the present invention is disclosed. Semiconductor device 110 is substantially similar to semiconductor device 10 (FIG. 1) except that semiconductor device 110 now includes a passivation layer 34 having a via 36 formed therein. In use, ball limiting metallurgy (not shown in FIG. 2) would be deposited in preparation for receiving a quantity of solder for joining to a package. The passivation layer 34 may be made from polyimide, photosensitive polyimide, fluorinated polyimide, benzocyclobutene (BCB), polytetrafluoroethylene (PTFE), silicon oxide, silicon oxynitride or other dielectric materials.

Figure 9:
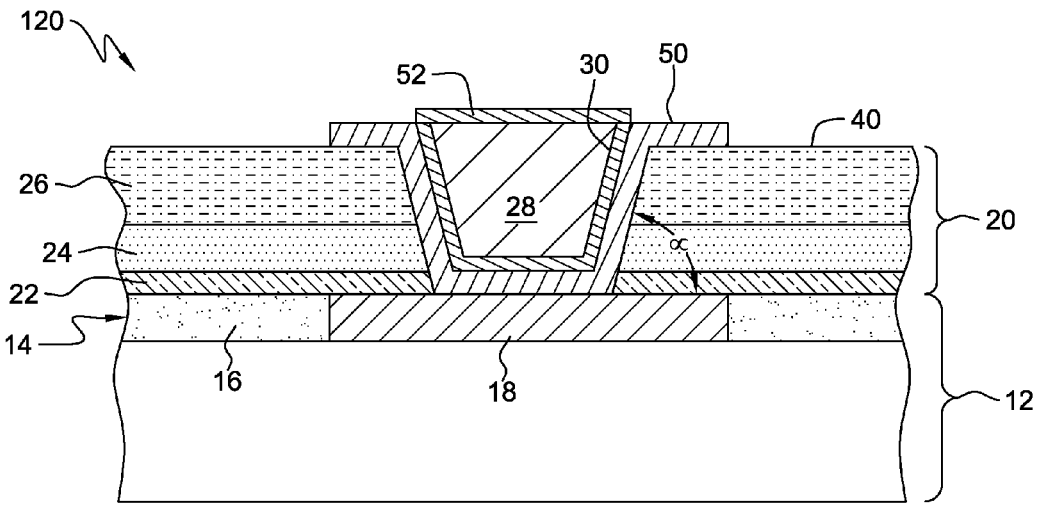
FIG. 9 is a cross section of a third embodiment of the present invention having an insulation layer with an aluminum layer and a copper plug.

Referring now to FIG. 9, a third embodiment of the present invention is disclosed. Semiconductor device 120 comprises a semiconductor substrate 12 which includes the semiconductor material, the front end of the line features such as the transistors and the back end of the line wiring layers. Only the last wiring layer 14 is shown in FIG. 9 for the sake of clarity. Last wiring layer 14 includes a dielectric material 16 and metallic wiring line 18. The materials of semiconductor substrate and last wiring layer 14 are the same as those discussed with respect to the first embodiment 10 shown in FIG. 1. Third embodiment semiconductor device 120 may also include insulation layer 20 having sublayers 22, 24 and 26 as discussed above with respect to FIG. 1. Semiconductor device 120 may further include an aluminum layer 50 in contact with the insulation layer 20. Portions of aluminum layer 50 may also extend to be present on the top surface 40 of insulation layer 20 as shown in FIG. 9. Thereafter, semiconductor device 120 further includes a preferred barrier layer 30 and copper plug 28. The thickness of the copper plug 28 may be moderated based on performance and process requirements. Then, an optional cap layer 52 of cobalt, cobalt/tungsten/phosphorus or other cobalt alloy may be deposited, for example by plating, on the copper plug 28. In subsequent processing, the surface of the copper plug 28 may be cleaned so that the optional cap layer 52 may not be necessary and may not need to be deposited. As noted previously, there are electromigration issues associated with a last aluminum layer but the inventive copper plug 28 of the present invention improves the electromigration of the semiconductor device 120.

Figure 10:
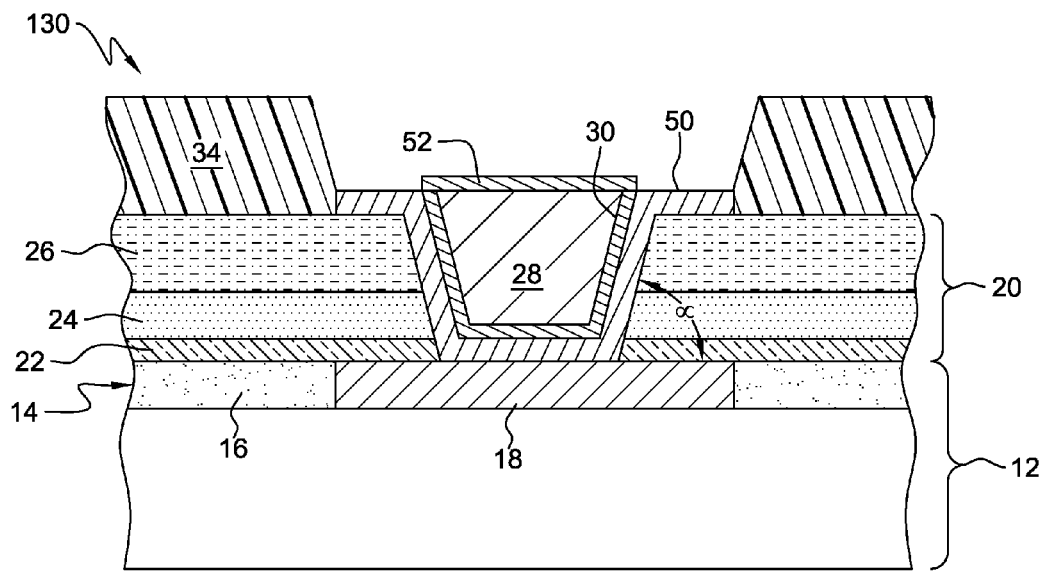
FIG. 10 is a cross section of a fourth embodiment of the present invention having an insulation layer with an aluminum layer and a copper plug and a passivation layer.

Referring now to FIG. 10, a fourth embodiment of the present invention is disclosed. Semiconductor device 130 is substantially similar to semiconductor device 120 (FIG. 9) except that semiconductor device 130 now includes a passivation layer 34 having a via 36 formed therein. In use, ball limiting metallurgy (not shown) would be deposited in preparation for receiving a quantity of solder for joining to a package. The passivation layer may be made of the same materials as passivation layer 34 in semiconductor device 110 in FIG. 2.

Figure 3:
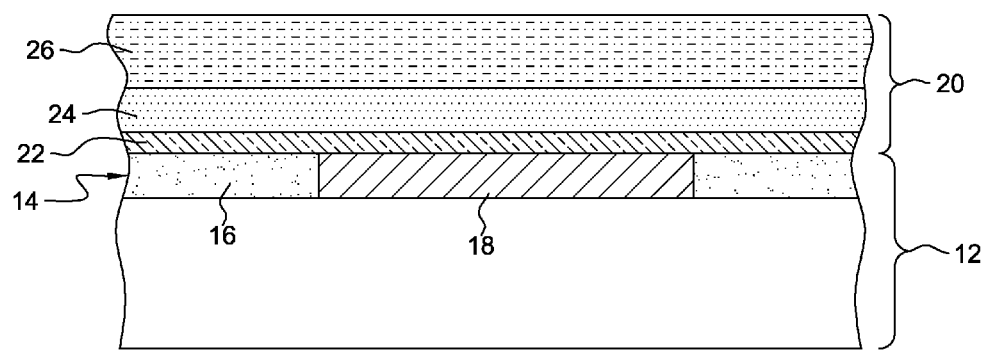
FIGS. 3 to 8 are cross-sectional views of the steps to form the first and second embodiments of the present invention.

Turning now to FIGS. 3 to 8, the process for forming the semiconductor devices 10, 110 of FIGS. 1 and 2 will be discussed. Referring first to FIG. 3, there is shown semiconductor substrate 12 which includes the semiconductor material, the front end of the line features such as the transistors and the back end of the line wiring layers. Only the last wiring layer 14 is shown in FIG. 3 for the sake of clarity. Last wiring layer 14 includes a dielectric material 16 and metallic wiring line 18. The metal in the metallic wiring line 18 is preferably copper due to its desirable electrical properties but could be any of the conductive materials discussed previously. On top of semiconductor substrate 12, an insulation layer 20 has been formed. The insulation layer 20 may comprise one or more individual sublayers. In one preferred embodiment, insulation layer 20 includes an NBLoK (nitrogen-doped silicon carbide) sublayer 22, a silicon dioxide sublayer 24 and a silicon nitride sublayer 26. Silicon nitride may be substituted for NBLoK sublayer 22 if desired. Other materials can be used for the insulation layer 20 as mentioned previously. In another preferred embodiment, there may be an additional nitride layer (not shown) between sublayers 22 and 24. Each of the sublayers 22, 24, 26 may be deposited by conventional methods such as plasma enhanced chemical vapor deposition. For purposes of illustration and not limitation, NBLoK sublayer 22 may have a thickness of 1000 angstroms while the silicon dioxide sublayer 24 and silicon nitride sublayer 26 may have a combined thickness of 8500 angstroms. Again, for purposes of illustration and not limitation, the thickness of the silicon dioxide sublayer 24 may be 4500 angstroms and the thickness of the silicon nitride sublayer 26 may be 4000 angstroms.

Figure 4:
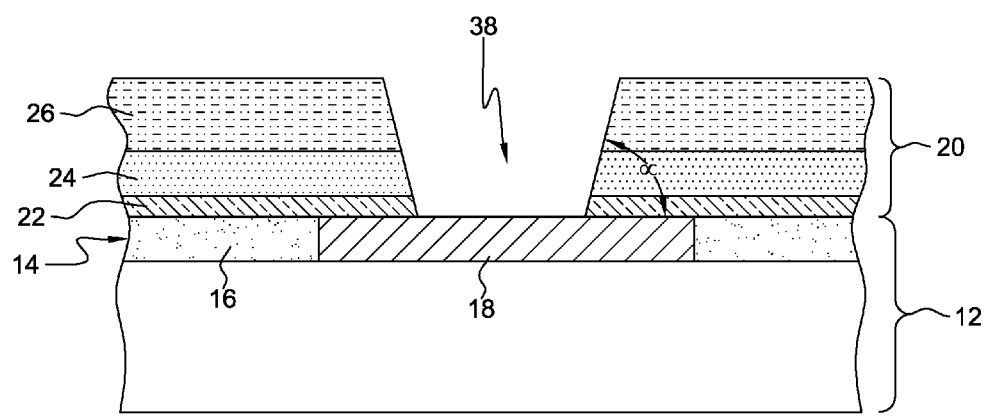

Referring now to FIG. 4, an opening 38 has been formed in the insulation layer 20. Opening 38 may be formed by conventional methods such as reactive ion etching. As can be seen, the walls of the opening 38 are most preferably not vertical but are tilted outwardly. The walls of the opening 38 should be inclined at an angle, $\alpha$, of 45 to 75 degrees, most preferably 60 degrees, with respect to the horizontal for the best current spreading application of the copper plug 28. This angle, $\alpha$, of inclination of the walls of the opening 38 also can be seen with respect to FIG. 9 where the walls of the via opening are inclined with respect to the horizontal. The etching through of sublayer 22, if an NBLoK layer, may require a different etch step than etching through sublayers 24, 26. Such a different etch step may be by reactive ion etching using fluorohydrocarbon chemistry such as $CHF_3$, $CH_2F_2$ or $CH_3F$. A post-reactive ion etching cleaning step such as ashing or a wet clean may also be desirable. After the formation of opening 38, the copper wiring 18 is exposed. Due to the propensity of the copper wiring 18 to oxidize, steps may be taken to keep the exposed copper wiring 18 in a nonoxidizing atmosphere during the processing described herein. Any residual oxidized copper should be removed prior to the next processing step.

Figure 5:
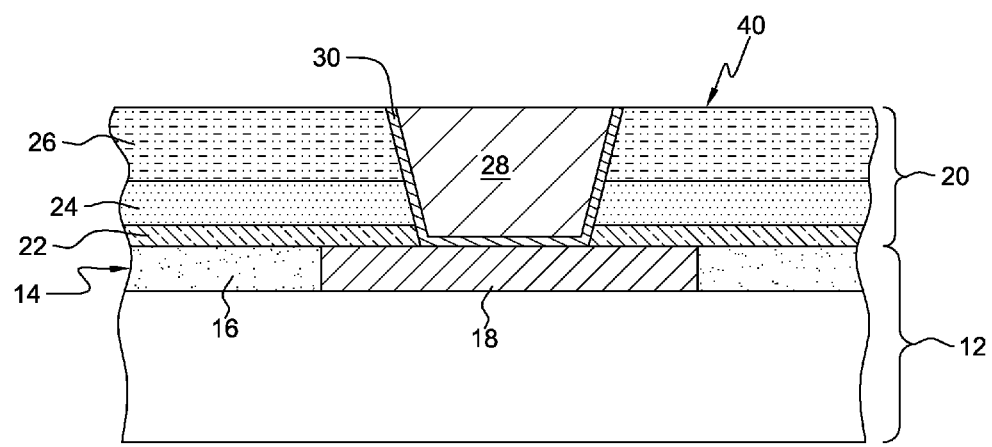

Referring now to FIG. 5, in one preferred embodiment, barrier layer 30 is deposited by conventional means such as chemical vapor deposition, physical vapor deposition, sputtering or plating so as to at least line the sides and bottom of opening 38 formed in the insulation layer 20. The barrier layer 30 may be any of the barrier layer materials mentioned previously. For purposes of illustration and not limitation, the barrier layer 30 may have a thickness of 1000 angstroms. Copper plug 28 is then formed by depositing copper on the sides and bottom of barrier layer 30. Sufficient copper should be deposited to at least fill the opening 38 and preferably overfill it. It is preferred that there be a significant overburden of copper, for example, overfilling by 5000 to 10000 angstroms. For purposes of illustration and not limitation, the copper plug 28 in one preferred embodiment may have a thickness of 8500 angstroms. Note that the thickness of 8500 angstroms for the copper plug 28 and the thickness of 1000 angstroms for the barrier layer 30 gives a total thickness of 9500 angstroms which is equal to the total thickness of the insulation layer 20. In another preferred embodiment, the barrier layer may be dispensed with and the thickness of the copper plug 28 would have to be increased to take up the space formerly occupied by the barrier layer 30.

The foregoing dimensions for the various layers and features are for purposes of illustration only and not for limitation. Contemporary and future semiconductor designs may call for thicknesses of the various layers and features to be thinner or thicker to meet the design requirements of such designs. Accordingly, such thinner or thicker thicknesses of the various layers and features discussed above are within the scope of the present invention.

Copper plug 28 may be deposited by any of several methods including electroplating, sputtering or plating. Since the materials of the barrier layer 30 and copper plug 28 may be deposited as a blanket film, these same materials need to be removed from the top surface 40 of the insulation layer 20. In one preferred method, the excess materials are removed by a chemical mechanical polishing process so that the materials of the barrier layer 30 and copper plug 28 only remain in the former opening 38 in the insulation layer 20 as shown in FIG. 5.

In a preferred embodiment of the present invention, through plating may be used to deposit the copper for copper plug 28. After deposition of the barrier layer 30, a resist would be deposited and photolithographically patterned to form an opening in the resist over opening 38. Thereafter, copper would be plated through the opening in the resist into opening 38. When sufficient copper has been deposited, the resist is stripped and any excess materials may be removed by a chemical mechanical polishing process. Alternatively, a selective etch process could be used to remove any excess copper in the field area, including both wet and dry etch options with compositions customized to the metallurgy of the barrier and fill materials to be removed.

In an alternative methodology of the present invention, the materials of the barrier layer 30 can be deposited and then the excess removed from top surface 40 by chemical mechanical polishing followed by the deposition of the copper for the copper plug 28 followed by another chemical mechanical polishing step. The alternative methodology of sequential chemical mechanical polishing steps is not preferred as there is an extra chemical mechanical polishing step involved.

Figure 6:
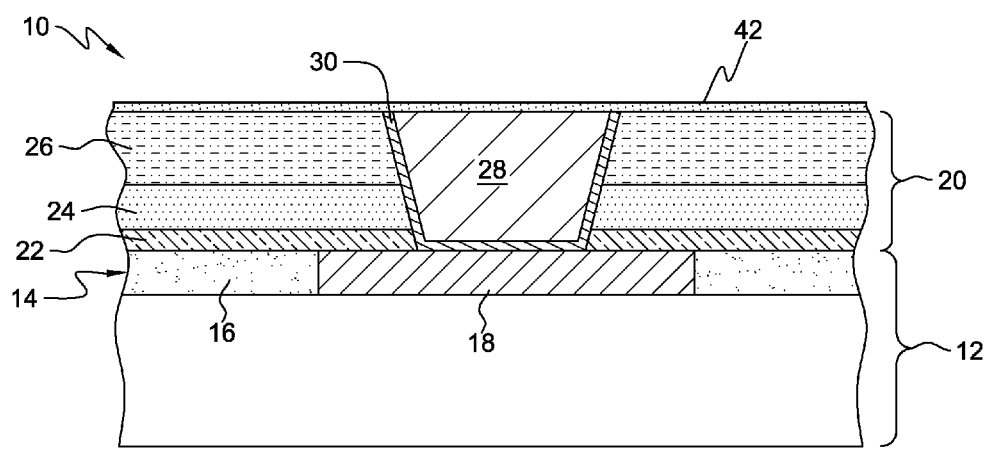

Referring now to FIG. 6, a preferred embodiment of the process according to the present invention is illustrated. A cap layer 42 is deposited by, for example, plasma enhanced chemical vapor deposition over the insulation layer 20, barrier layer 30 and copper plug 28. The cap layer 42 may be a nitride layer such as NBLoK or silicon nitride and deposited to a thickness of 500 angstroms or less. Cap layer 42 is optional but is preferred to prevent oxidation of the copper in copper plug 28. The specified material and thickness of the cap layer 42 are for the purpose of illustration and not limitation.

At this point in the processing, semiconductor device 10 as illustrated in FIG. 1 has been completed.

Figure 7:
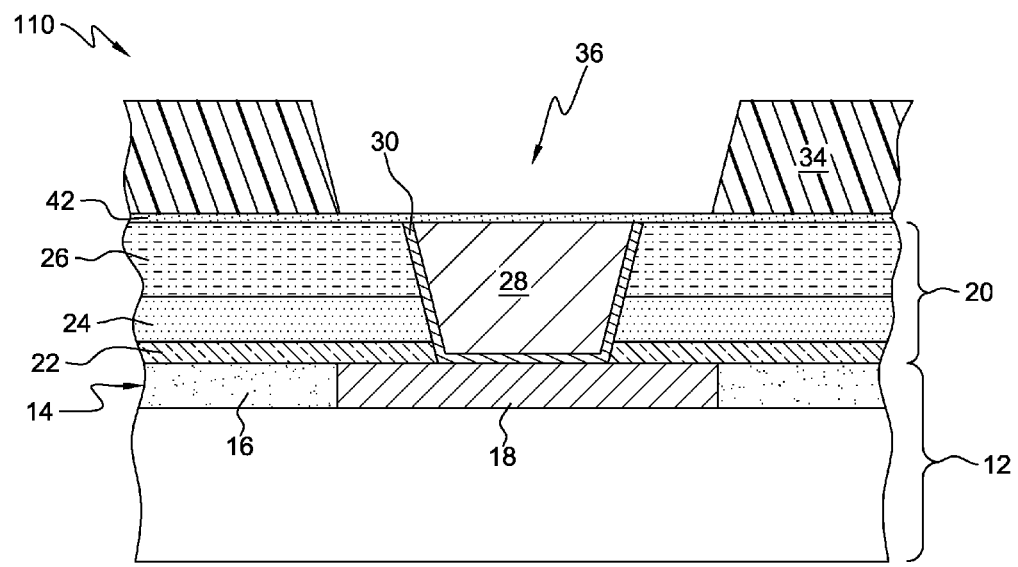

Referring now to FIG. 7, a passivation layer 34 is conventionally deposited such as by a spin apply method. Subsequently, the passivation layer 34 is photolithographically patterned and etched such as by reactive ion etching to form opening 36.

At this point in the processing, semiconductor device 110 as illustrated in FIG. 2 has been completed.

Figure 8:
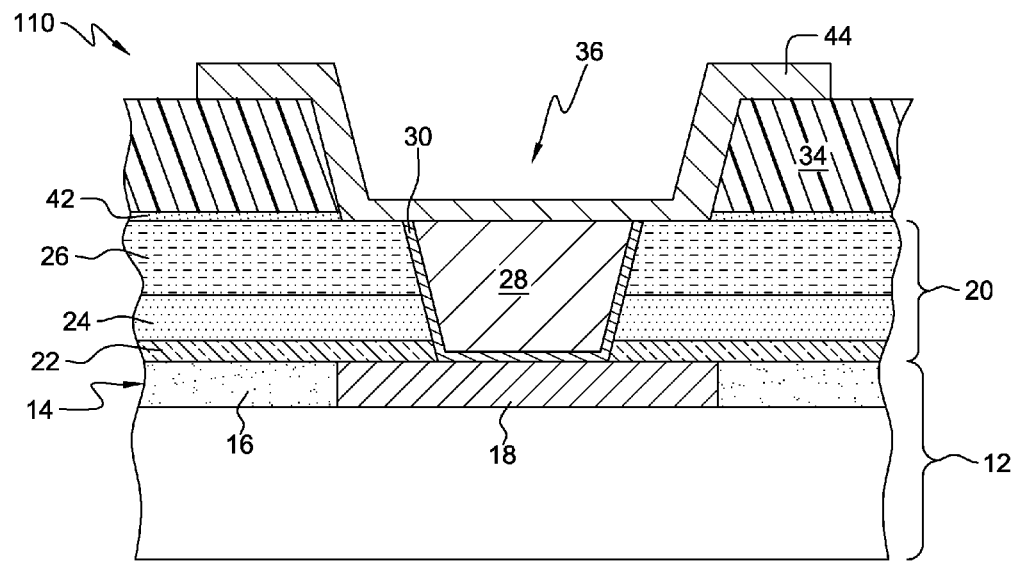

Referring now to FIG. 8, the portion of cap layer 42 within opening 38 is etched open by reactive ion etching and then conventional ball limiting metallurgy 44 is deposited. Subsequently, a quantity of solder (not shown) would be deposited on ball limiting metallurgy 44 within opening 38 for joining the semiconductor device 110 to a package (not shown).

The process for making semiconductor device 120 (FIG. 9) is similar to that of semiconductor devices 10, 110 except for the addition of the aluminum layer 50 and the cap layer 52. The aluminum may be deposited and patterned by conventional means. It is most preferred to deposit the copper by through plating to the desired thickness. Copper plug 28 need not be flush with aluminum layer 50. If copper plug 28 has a cap layer 52, the cap layer 52 need not be flush with aluminum layer 50.

The process for making semiconductor device 130 (FIG. 10) is similar to that of semiconductor device 120 except that a passivation layer 34 may be deposited as described previously. The passivation layer 34 may be lithographically patterned and then ball limiting metallurgy deposited if desired.

The above-described process for manufacturing semiconductor device 110 may be modified so that passivation layer 34 is deposited before the copper plug 28 is deposited. In this modified process, opening 38 may be formed and then passivation layer 34 is deposited. The passivation layer 34 may be photolithographically patterned to form opening 36 and also remove any passivation material from opening 38. Thereafter, barrier layer 30 may be deposited by blanket deposition followed by through plating of the copper plug 28 using a bottoms-up plating process. Thereafter, ball limiting metallurgy may be deposited, if desired.

The above-described process for manufacturing semiconductor device 130 having a passivation layer 34 may be modified so that a passivation layer 34 is deposited before the copper plug 28 is deposited. In this modified process, an opening in the insulating layer 20 may be formed, followed by aluminum layer 50 and then a passivation layer 34 is deposited. The passivation layer may be photolithographically patterned to form an opening 36 and also remove any passivation material from the opening in the insulating layer 20. Thereafter, barrier layer 30 may be deposited by blanket deposition followed by through plating of the copper plug 28 using a bottoms-up plating process followed by cap layer 52. Thereafter, ball limiting metallurgy may be deposited, if desired.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

We claim:
1. A semiconductor device comprising:
  a semiconductor substrate having a plurality of wiring layers wherein a last wiring level comprises a conductive material;
  an insulation layer formed on the last wiring layer, the insulation layer having a via opening formed therein to expose the conductive material in the last wiring layer, the via opening extending to a full thickness of the insulation layer;
  an aluminum layer in the via opening extending to a height above the full thickness of the insulation layer and the entire via opening, the aluminum layer having a wall and a bottom;
  a barrier layer formed on the aluminum layer, the barrier layer having a wall and a bottom coextensive with the aluminum layer wall and bottom; and
  a copper plug formed on the barrier layer and in contact with all of the barrier layer wall and bottom and filling the entire via opening, the copper plug extending to the height above the full thickness of the insulation layer.

2. The semiconductor device of claim 1 wherein the aluminum layer extends over the insulation layer.

3. The semiconductor device of claim 1 wherein the aluminum layer is in contact with the conductive material in the last wiring layer.

4. The semiconductor device of claim 1 wherein the aluminum layer is in direct contact with the conductive material in the last wiring layer.

5. The semiconductor device of claim 1 further comprising a cap layer formed over the copper plug.

6. The semiconductor device of claim 5 wherein the barrier layer has an edge portion between the aluminum layer and the copper plug and the cap layer is formed only over the edge portion of the barrier layer and the copper plug.

7. The semiconductor device of claim 5 wherein the cap layer is selected from the group consisting of cobalt, cobalt/tungsten/phosphorus, and cobalt alloys.

8. The semiconductor device of claim 1 wherein the barrier layer is selected from the group consisting of tantalum/tantalum nitride, titanium, titanium tungsten, titanium nitride and tungsten nitride.

9. The semiconductor device of claim 1 further comprising a dielectric layer formed on the insulation layer and having an opening aligned with the copper plug.

10. The semiconductor device of claim 9 further comprising ball limiting metallurgy formed on the dielectric layer and in the opening.

11. The semiconductor device of claim 1 wherein the copper plug has a wall which makes an angle with respect to the last wiring layer of 45 to 75 degrees.

12. A method of forming a semiconductor device comprising:
    obtaining a semiconductor substrate having a plurality of wiring layers wherein a last wiring layer comprises a conductive material;
    forming an insulation layer on the last wiring layer, the insulation layer having a thickness,
    forming a via opening in the insulation layer to expose the conductive material in the last wiring layer, the via opening extending to the full thickness of the insulation;
    forming an aluminum layer in the via opening, the aluminum layer extending to a height above the full thickness of the insulation layer and the entire via opening, the aluminum layer having a wall and a bottom;
    forming a barrier layer on the aluminum layer, the barrier layer having a wall and a bottom coextensive with the aluminum wall and bottom; and
    forming a copper plug on the barrier layer and in contact with all of the barrier layer wall and bottom and filling the entire via opening, the copper plug extending to the height above the full thickness of the insulation layer.

13. The method of claim 12 wherein the forming of the aluminum layer includes extending the aluminum layer over the insulation layer.

14. The method of claim 12 wherein the aluminum layer is contacting the conductive material in the last wiring layer.

15. The method of claim 12 wherein the aluminum layer is directly contacting the conductive material in the last wiring layer.

16. The method of claim 12 further comprising forming a cap layer over the copper plug.

17. The method of claim 16 wherein the barrier layer has an edge portion between the aluminum layer and the copper plug and wherein forming the cap layer is forming the cap layer only over the edge portion of the barrier layer and the copper plug.

18. The method of claim 16 wherein the cap layer is selected from the group consisting of cobalt, cobalt/tungsten/phosphorus, and cobalt alloys.

19. The method of claim 12 further comprising forming a dielectric layer on the insulation layer and having an opening aligned with the copper plug.

20. The method of claim 19 further comprising forming a ball limiting metallurgy on the dielectric layer and in the opening.

21. A semiconductor device comprising:
    a semiconductor substrate having a plurality of wiring layers wherein a last wiring level comprises a conductive material;
    an insulation layer formed on the last wiring layer, the insulation layer having a via opening formed therein to expose the conductive material in the last wiring layer;
    an aluminum layer in the via opening and includes a portion over an upper surface of the insulation layer, the aluminum layer having a wall and a bottom, the wall having a height that is greater than a height of the upper surface of the insulation layer;
    a barrier layer formed on the aluminum layer, the barrier layer limited to covering only the wall and bottom of the aluminum layer and not extending beyond the aluminum layer; and
    a copper plug formed on the barrier layer and in the via opening and filling the entire via opening, the copper plug extending above the height of the upper surface of the insulation layer so as to be coplanar with the portion of the aluminum layer.

* * * * *